United States Patent [19]
Kudo

[11] Patent Number: 5,436,171
[45] Date of Patent: Jul. 25, 1995

[54] PHOTODIODE ARRAY DEVICE AND METHOD FOR PRODUCING SAME

[75] Inventor: Koichi Kudo, Kyoto, Japan

[73] Assignee: Rohm Co., Ltd., Kyoto, Japan

[21] Appl. No.: 263,079

[22] Filed: Jun. 21, 1994

Related U.S. Application Data

[62] Division of Ser. No. 992,115, Dec. 17, 1992, Pat. No. 5,367,188.

[30] Foreign Application Priority Data

Dec. 20, 1991 [JP] Japan .................. 3-355876

[51] Int. Cl.$^6$ .................. H01L 21/22; H01L 21/302
[52] U.S. Cl. .................. 437/3; 437/153; 437/974
[58] Field of Search .................. 148/D18, D135, D153; 437/3, 86, 153, 953, 914, 966, 974, 5; 257/461

[56] References Cited

U.S. PATENT DOCUMENTS

| | | | |
|---|---|---|---|
| 3,690,953 | 9/1972 | Wise | 257/461 |
| 3,982,315 | 9/1976 | Kubo | 437/3 |
| 3,994,012 | 11/1976 | Warner, Jr. | 257/461 |
| 4,312,114 | 1/1982 | Schoolar | 437/153 |
| 4,826,777 | 5/1989 | Ondris | 437/3 |

FOREIGN PATENT DOCUMENTS 245953 2/1990 Japan .

OTHER PUBLICATIONS

Haisma et al., "Silicon-on-Insulator Wafer Bonding-Wafer Thinning Technological Evaluations", Jap. Jour. Appl. Phys., vol. 28, No. 8, pp. 1427–1428, 1989.

*Primary Examiner*—George Fourson
*Assistant Examiner*—Thomas G. Bilodeau
*Attorney, Agent, or Firm*—Brumbaugh, Graves, Donohue & Raymond

[57] ABSTRACT

The improved photodiode array has a structure that has pn-junctions arranged in a row on a semiconductor substrate 1 having an oxide film 2. The photodiode array has such a surface pattern that n-type impurity diffused layers 3 and p-type impurity diffused layers 4 are arranged in a generally concentric manner or with layers of one diffusion type alternating with layers of the other diffusion type. The improved process of fabrication comprises joining the oxide film 2 on the semiconductor substrate 1 to an n-type semiconductor layer 3 and then diffusing a p-type impurity within the n-type semiconductor layer 3 to form pn-junctions, thereby yielding a photodiode array. Thereby, it is provided a photodiode array that has such a simple structure that not only is the yield of device fabrication improved but also the cost of the final product is reduced.

5 Claims, 6 Drawing Sheets

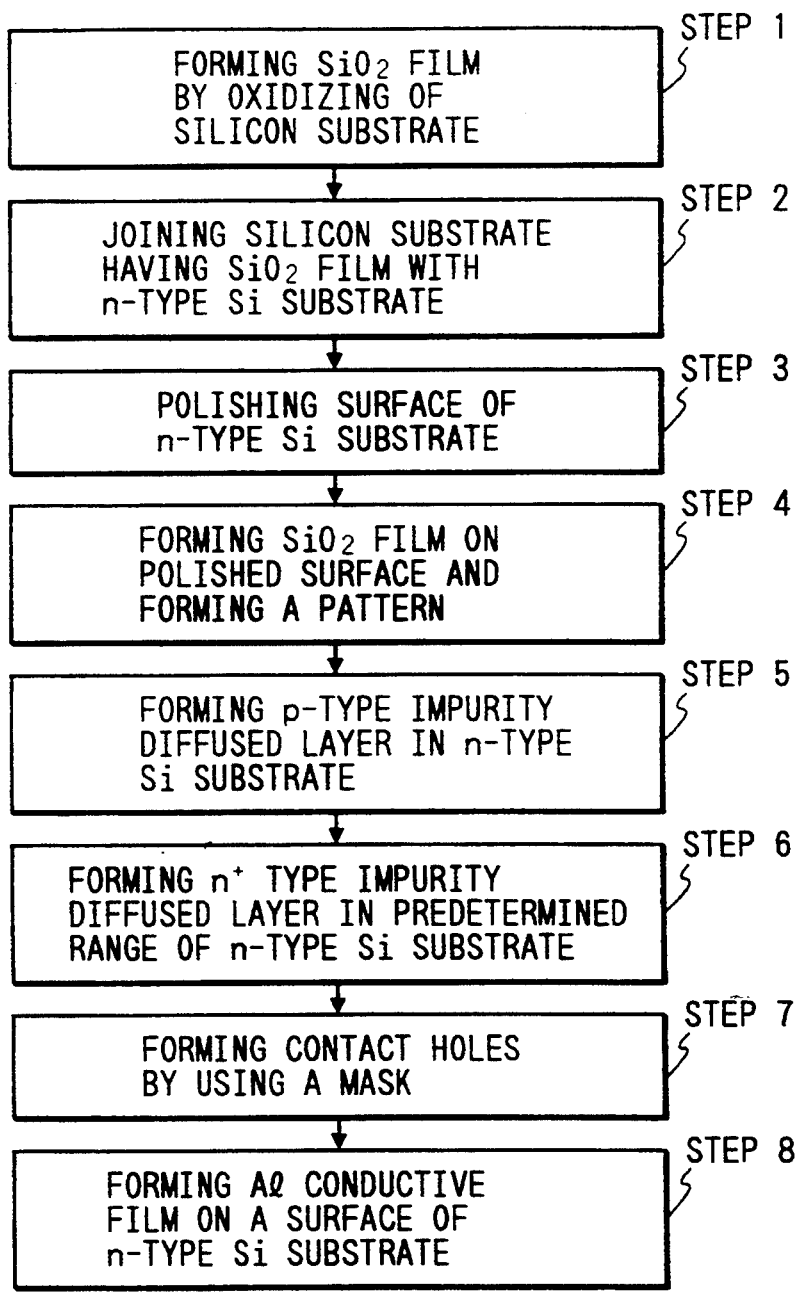

5,436,171

PHOTODIODE ARRAY DEVICE AND METHOD FOR PRODUCING SAME

This application is a division of application Ser. No. 07/992,115, filed on Dec. 17, 1992 now U.S. Pat. No. 5,367,188.

BACKGROUND OF THE INVENTION

1. Field of the Invention

The present invention relates to a photodiode array and a process for producing thereof. More particularly, the present invention relates to a photodiode array having a novel structure and a process for producing such a photodiode array.

2. Description of Conventional Art

A conventional photodiode array is depicted in FIG. 13. Part of an n-type polysilicon substrate 101 is isolated into a plurality of regions by silicon oxide films 102 and a p-type impurity diffused layer 103 is formed in each of the isolated regions and high density n-type impurity diffused layers 104 are provided in the surface layer portion of the p-type impurity diffused layers 103 to produce a multiple of pn-junctions, which are connected in series by a conductive film 106 as they are insulated appropriately with silicon oxide films 105.

However, as is also apparent from FIG. 13, the photodiode array thus fabricated has the isolating oxide films formed within the semiconductor substrate 101, with pn-junctions being formed in the isolated regions, and this contributes to the complexity of the device structure. As a result, not only is the yield of device fabrication low but the cost of the final product also increases.

SUMMARY OF THE INVENTION

The present invention has been accomplished under these circumstances and has as an object providing a photodiode array that has such a simple structure that not only is the yield of device fabrication improved but also the cost of the product is reduced. Another object of the present invention is to provide a process for fabricating said photodiode array.

The first object of the present invention can be attained by a photodiode array having at least a structure that comprises: a substrate; an insulating film laminated on said substrate; a first impurity diffused layer provided on said insulating film; second impurity diffused layers that have a polarity opposite to that of the first impurity diffused layer and which are formed in the first impurity diffused layer so as to form a plurality of pn-junctions in a row within the first impurity diffused layer; high-density impurity diffused layers that have the same polarity as the first impurity diffused layer and which are formed in a surface layer on the side, away from said insulating film, of the pn-junctions composed by said first and second impurity diffused layers; thin-film oxide layers that are each provided at one end in that part of said high-density impurity diffused layers which faces said first impurity diffused layer and which each extend at the other end to the impurity diffused layer having a polarity different from said high-density impurity diffused layers; and thin-film electrode layers each provided between said thin-film oxide layers.

The first impurity diffused layer in the photodiode array of the present invention may be an n-type or p-type impurity diffused layer. The second impurity diffused layers may be p-type or n-type impurity diffused layers.

In addition to the structure described above, the photodiode array of the present invention has preferably a surface pattern comprising a first and a second group each having the first and second impurity diffused layers arranged in a generally concentric manner, or a surface pattern comprising the first impurity diffused layer that alternates with the second impurity diffused layer.

The second object of the present invention can be attained by a process for fabricating a photodiode array that comprises at least the steps of:

(1) forming a thin-film oxide layer on a surface of a semiconductor substrate;

(2) joining the semiconductor substrate having said thin-film oxide layer to a semiconductor substrate of a first impurity diffusion type;

(3) polishing a surface of said joined semiconductor substrate of a first impurity diffusion type;

(4) forming second impurity diffused layers on said surface-polished semiconductor substrate of a first impurity diffusion type in such a way that pn-junctions will be formed in a row through a longitudinal section of said substrate;

(5) forming impurity diffused layers at high density in a predetermined area of the surface layer portion of said pn-junctions, said impurity diffused layers having the same polarity as the first impurity diffused layer formed of the substrate of a first impurity diffusion type;

(6) forming thin-film oxide layers in a predetermined surface area of said pn-junctions; and (7) forming thin-film electrode layers that connect between the thin-film oxide layers formed in a predetermined surface area of said pn-junctions.

The process includes preferably an additional patterning step for providing either a surface pattern that has the first and second impurity diffused layers arranged in a generally concentric manner or a surface pattern that comprises the first impurity diffused layer that alternates with the second impurity diffused layer.

The photodiode array of the present invention has no need of forming silicon oxide films within a semiconductor substrate for the purpose of isolating pn-junctions and, hence, it features a simple sectional structure.

The process of the present invention insures that this improved photodiode array can be fabricated without involving complicated steps.

BRIEF DESCRIPTION OF THE DRAWINGS

FIG. 12 is a flow chart of the process for fabricating he photodiode array of the first embodiment.

DETAILED DESCRIPTION OF PREFERRED EMBODIMENTS

The preferred embodiments of the present invention are described below with reference to accompanying drawings but it should be understood that the invention is by no means limited to those embodiments alone.

Figure 1:
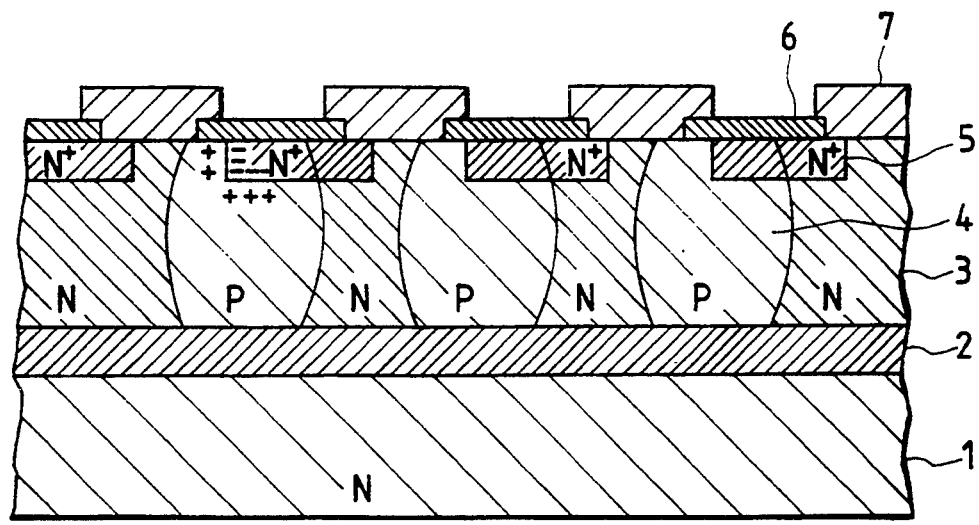
FIG. 1 is a longitudinal sectional view of a photodiode array according to the first embodiment of the present invention.
Figure 2:
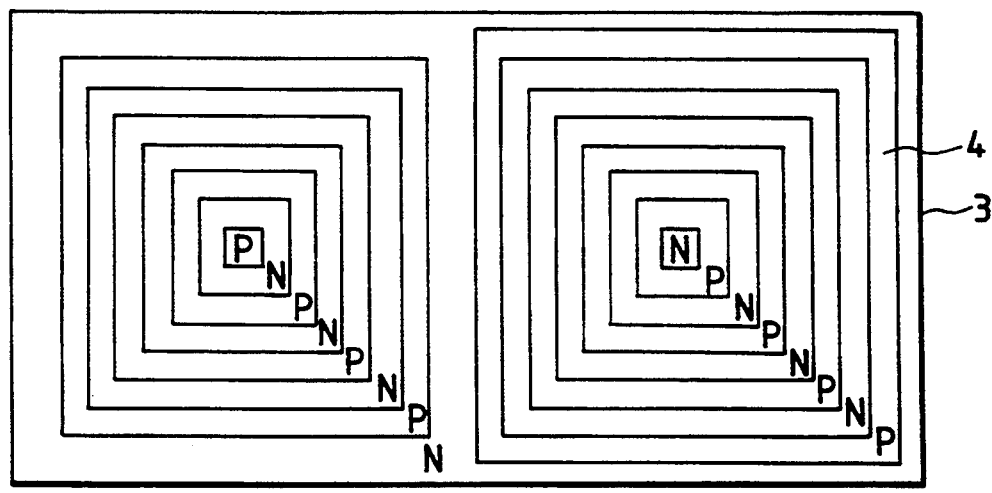
FIG. 2 is a diagram showing the surface pattern of the photodiode array of the first embodiment.

As shown in FIG. 1, the photodiode array according to the first embodiment of the present invention has at least a structure that comprises: a semiconductor substrate 1; an insulating oxide film 2 laminated on the semiconductor substrate 1; an n-type semiconductor layer 3 provided on the insulating oxide film 2; a plurality of p-type impurity diffused layers 4 that are formed in the n-type semiconductor layer 3 at predetermined spacings; high-density n-type impurity diffused layers 5 formed at predetermined spacings in a predetermined area of the surface layer portion of the n-type semiconductor layer 3 in which the p-type impurity diffused layers 4 are formed; insulating silicon oxide layers 6 that are each provided at one end in that part of the high-density n-type impurity diffused layers which faces the n-type semiconductor layer 3 and which each extend at the other end to the p-type impurity diffused layer 4; and thin film electrode layers 7 that are each formed between the adjacent insulating silicon oxide layers 6 and which make ohmic contact with the pn-junction formed in each of the n-type semiconductor layers 3. FIG. 2 shows schematically the surface pattern that appears on the surface of the n-type semiconductor layers 3 in the first embodiment of the present invention. As is clear from FIG. 2, two patterns each comprising the n-type semiconductor layer 3 and the p-type impurity diffused layer 4 that are arranged in a substantially concentric fashion are formed in the first embodiment of the present invention. One of those two patterns provides an anode whereas the other pattern provides a cathode.

Although not shown, contact holes, a surface protective layer, pad bonding holes, etc. are formed in the first embodiment as in the prior art photodiode array.

The semiconductor substrate 1 will serve as a support of the active regions to be laminated thereon and should, hence, have an adequate strength. Typically, the substrate has a thickness in the range of 200–500 um.

The insulating oxide film 2 is formed of silicon oxide and has typically a thickness of 1,000–10,000 Å.

The n-type semiconductor layer 3 has typically a thickness of 5–20 um in order to limit the depth of diffusion.

The p-type impurity diffused layers 4 each have typically a longitudinal width of diffusion that is insufficient to make contact with the high density n-type impurity diffused layer and/or p-type impurity diffused layer on the adjacent surface. The p-type impurity diffused layers 4 are spaced apart by distances that are insufficient for the diffusion regions to contact the diffusion region of an adjacent cell.

The high density n-type impurity diffused layers have typically a diffusion depth of 1–3 um. Their diffusion width lies typically within a range where they do not make contact with the p-type impurity diffused region and/or n-type impurity diffused region in an adjacent cell.

To insure effective insulation or isolation, the insulating silicon oxide layers 6 have typically a thickness of 1,000–10,000 Å. If the requirements for insulating property and adequate light transparency are met, the insulating layers 6 are in no way limited to a silicon oxide film and other films such as a nitride film may also be used with advantage.

The thin-film electrode layers 7 are typically aluminum films having a thickness of 1.0–2.0 um.

Figure 3:
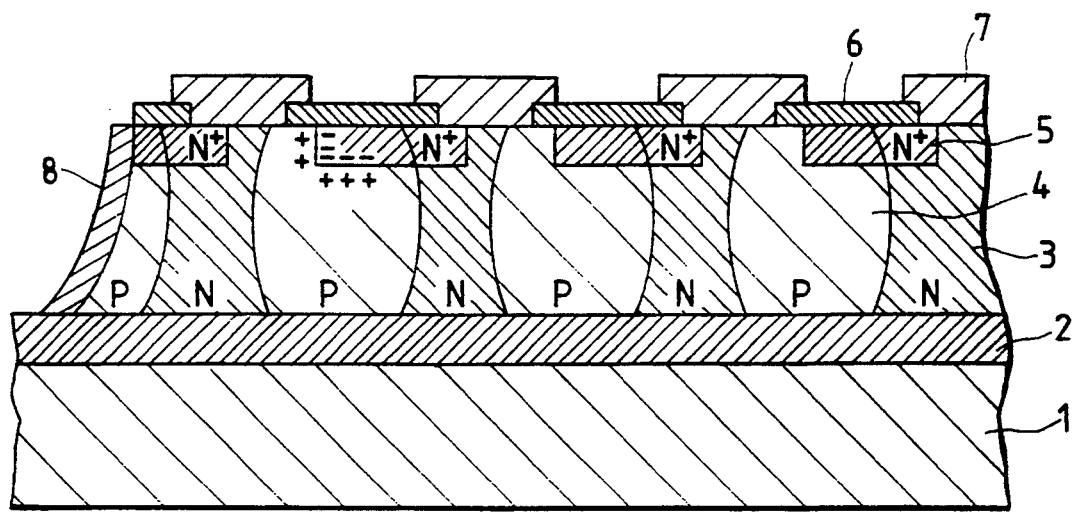
FIG. 3 is a longitudinal sectional view of a photodiode array according to the second embodiment of the present invention.
Figure 4:
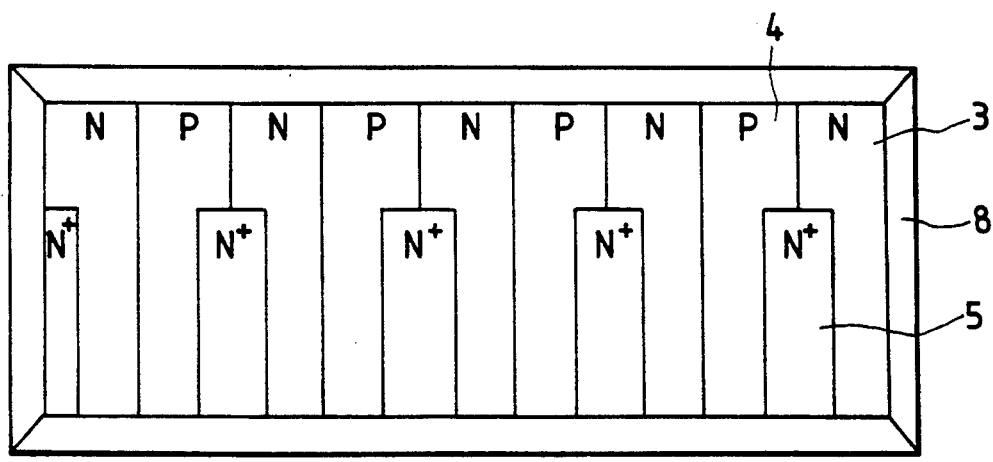
FIG. 4 is a diagram sowing the surface pattern of the photodiode array of the second embodiment.
Figure 5:
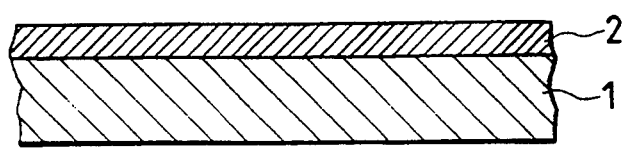
FIGS. 5–11 show the sequence of steps involved in a process for fabricating the photodiode array according to the first embodiment of the present invention.
Figure 6:
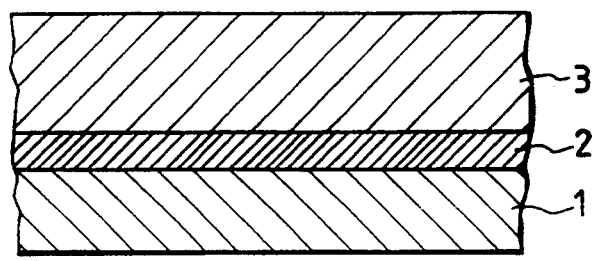
Figure 7:
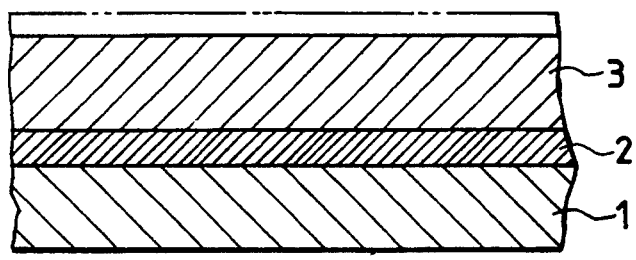
Figure 8:
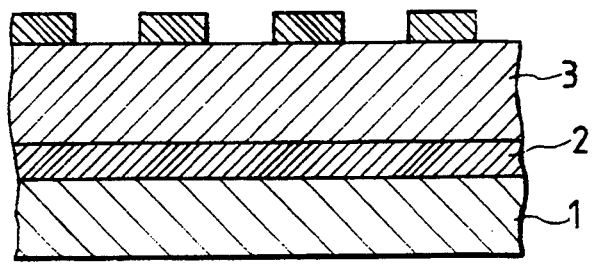
Figure 9:
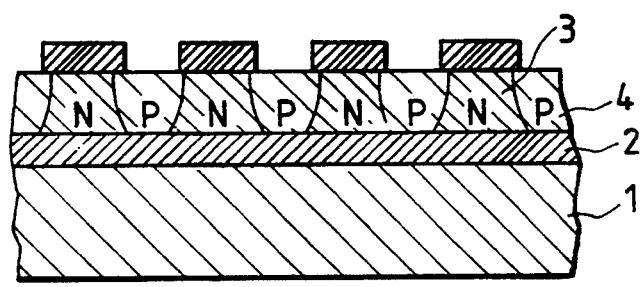
Figure 10:
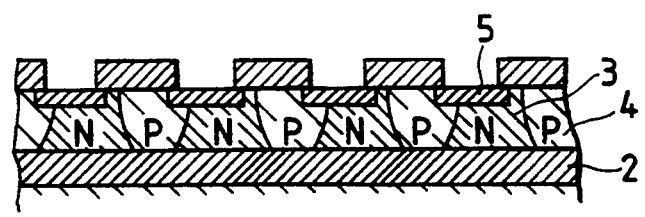
Figure 11:
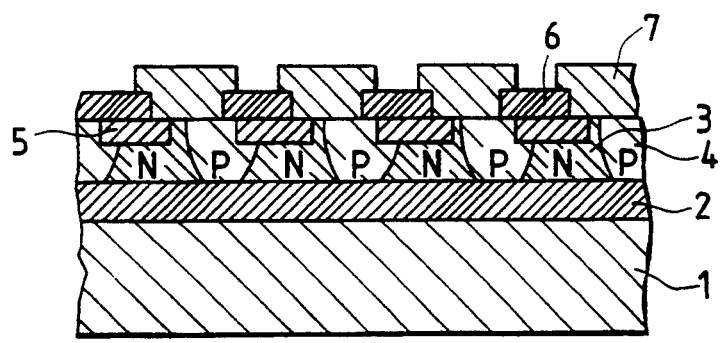
Figure 13:
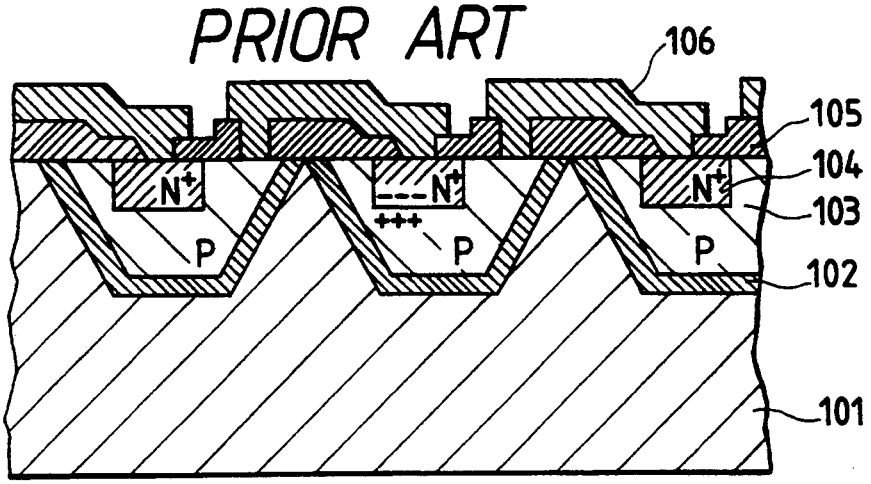
FIG. 13 is a longitudinal sectional view of a conventional photodiode array.

As shown in FIG. 3, the photodiode array according to the second embodiment of the present invention has the same structure as in the first embodiment shown in FIG. 1 except that a silicon oxide film 8 is formed on the periphery. As is clear from FIG. 4, the second embodiment of the present invention has a surface pattern in which n-type semiconductor layers 3 alternate with p-type impurity diffused layers 4. The silicon oxide film 8 is provided in order to insure that there will be no current leakage from the periphery of pn-junctions.

Although not shown, contact holes, a surface protective layer, pad bonding holes, etc. are also formed in the second embodiment as in the prior art photodiode array and this is the case already mentioned in connection with the first embodiment.

The process for fabricating the photodiode array according to the first embodiment is described below with reference to FIGS. 5–11 which depict the sequence of steps involved, as well as FIG. 12 which is a flow chart of the process.

Step 1: Silicon oxide film 2 is formed on a semiconductor substrate 1 (see FIG. 5).

Step 2: The semiconductor substrate 1 as prepared in step 1 and an n-type semiconductor substrate (no oxide film is formed on the n-type semiconductor substrate) are put together with the oxide film 2 on the semiconductor substrate 1 facing a surface of the n-type semiconductor. The two substrates are juxtaposed in slots in a diffusion quartz boat. With an $O_2$ gas or water vapor atmosphere being formed in a diffusion furnace at 900°–1,000° C., the substrates are left to stand or a predetermined time so that the semiconductor substrate 1 is joined to the n-type semiconductor substrate which is subsequently used as an n-type semiconductor layer 3 (see FIG. 6).

Step 3: The surface of the n-type semiconductor layer 3 is polished in such a way that the thickness as measured from the oxide film 2 to the surface of the n-type semiconductor layer 3 is 5–20 um (see FIG. 7).

Step 4: An insulating silicon oxide film is formed on the surface of the n-type semiconductor layer 3. Thereafter, a predetermined region of the oxide film is stripped with the aid of a p-type diffusion mask so as to form a selective diffusion pattern (see FIG. 8).

Step 5: After forming a predetermined pattern in the insulating silicon oxide layer, p-type impurity diffused layers 4 are formed concentrically in the n-type semiconductor layer 3 with the patterned insulating silicon oxide layer being used as a mask (see FIG. 9).

Step 6: High-density n-type impurity diffused layers 5 are formed in a predetermined range of the concentric pattern of p-type impurity diffused layers 4 using a mask of a predetermined shape (see FIG. 10).

Step 7: Contact holes are formed in a predetermined region using a rectangular mask.

Step 8: Conductive films 7 are formed on the surface of the n-type semiconductor layer 3 using a mask of a predetermined shape in order to establish ohmic contact between the pn-junctions formed in the n-type semiconductor layer 3. The conductive films 7 are insulated with insulating silicon oxide layers 6 in an appropriate manner (see FIG. 11).

Subsequently, a surface protective layer, pad bonding holes, etc. are formed as in the prior art process, thereby completing the fabrication of a photodiode array.

The process of fabricating a photodiode array according to the second embodiment of the present invention is generally the same as in the first embodiment and only the differences between the processes of the two embodiments are described below.

Step 4A: Insulating silicon oxide layers are formed at predetermined spacings on the surface of the n-type semiconductor layer 3 using a ladder-like mask.

Step 5A: P-type impurity diffused layers 4 are formed in the n-type semiconductor layer 3 in such a way as to provide a surface pattern where pn-junctions are arranged in a row.

Step 9: The periphery of the n-type semiconductor layer 3 is stripped over a predetermined range to insure that no part of the pn-junctions will be shorted.

Step 10: A silicon oxide film 8 is formed on the periphery of the n-type semiconductor layer 3 to insure that no current will leak from the pn-junctions that have been exposed as a result of peripheral stripping in Step 9.

The photodiode arrays of the embodiments described above have p-type impurity diffused layers formed in an n-type semiconductor substrate (or layer). It should, however, be noted that the semiconductor substrate that can be used is in no way limited to an n-type substrate and a p-type semiconductor substrate can also be used with advantage. Needless to say, an n-type impurity must be diffused within a p-type semiconductor substrate.

As described on the foregoing pages, the photodiode array of the present invention has such a simple structure as seen through a longitudinal section that it can be fabricated by a simple process. Therefore, not only is the yield of device fabrication improved but also the cost of the final product can be reduced.

The process of the present invention insures that the photodiode array having the features described above can be fabricated by a simplified sequence of steps and, hence, the cost of the final product can be reduced.

I claim:

1. A method for producing a photodiode array, comprising the steps of:
    forming an oxide layer on a surface of a semiconductor substrate;
    joining the semiconductor substrate having said oxide layer to a semiconductor substrate of a first conductive impurity type, with the oxide layer between the semiconductor substrate;
    polishing a surface of said joined semiconductor substrate of a first conductive impurity type;
    forming second conductive impurity-type layers in said surface-polished semiconductor substrate of a first conductive impurity type in such a way that pn-junctions are formed in a row extending along the surface of said surface-polished substrate so that first conductive impurity type layers are produced;
    forming third conductive impurity diffused layers, having a higher conductive impurity concentration than the second conductive impurity type layer, in surface layer portions of said surface-polished substrate so as to span said pn-junctions, said third conductive impurity diffused layers having the same conductivity type as the substrate of a first conductive impurity type;
    forming second oxide layers in surface areas of said pn-junctions; and
    forming electrode layers that extend between the second oxide layers formed in surface areas of said pn-junctions.

2. A method according to claim 1 wherein said substrate of a first conductive impurity type is an n-type substrate and said second conductive impurity-type layers are each a p-type impurity layer.

3. A method according to claim 1 wherein said substrate of a first conductive impurity type is a p-type substrate and said second conductive impurity-type layers are each an n-type impurity layer.

4. A method according to claim 1 which includes an additional patterning step for providing a surface pattern that has said first conductive impurity-type and second conductive impurity-type layers arranged in a substantially concentric manner.

5. A process according to claim 1 which includes an additional patterning step for providing a surface pattern that comprises said first conductive impurity-type layers alternating with said second conductive impurity-type layers in a linear array.

* * * * *